United States Patent
Furuichi et al.

(10) Patent No.: US 10,871,760 B2
(45) Date of Patent: *Dec. 22, 2020

(54) MOUNTING BOARD MANUFACTURING SYSTEM AND MOUNTING BOARD MANUFACTURING METHOD

(71) Applicant: Panasonic Intellectual Property Management Co., Ltd., Osaka (JP)

(72) Inventors: Satoshi Furuichi, Fukuoka (JP); Masahiro Kihara, Fukuoka (JP); Toshihiko Nagaya, Fukuoka (JP); Masahiro Taniguchi, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/833,721

(22) Filed: Mar. 30, 2020

(65) Prior Publication Data

US 2020/0225637 A1     Jul. 16, 2020

Related U.S. Application Data

(63) Continuation of application No. 16/057,848, filed on Aug. 8, 2018, now Pat. No. 10,656,619.

(30) Foreign Application Priority Data

Aug. 24, 2017   (JP) ................. 2017-160713

(51) Int. Cl.
    *G05B 19/402*     (2006.01)
    *G05B 19/4063*     (2006.01)

(52) U.S. Cl.
    CPC ....... *G05B 19/402* (2013.01); *G05B 19/4063* (2013.01); *G05B 2219/45026* (2013.01)

(58) Field of Classification Search
    CPC .............. G05B 19/402; G05B 19/4063; G05B 2219/45026; H05K 13/0815; H05K 13/083
    USPC .................................................. 700/108, 121
    See application file for complete search history.

(56) References Cited

U.S. PATENT DOCUMENTS

| | | | |
|---|---|---|---|
| 6,457,232 B1 | 10/2002 | Isogai et al. | |
| 8,240,543 B2 | 8/2012 | Nishi et al. | |
| 8,371,027 B2 | 2/2013 | Inoue et al. | |
| 8,712,572 B2 | 4/2014 | Higashi et al. | |
| 2002/0071602 A1 | 6/2002 | Nakano et al. | |

(Continued)

FOREIGN PATENT DOCUMENTS

JP     2016-058603 A     4/2016

*Primary Examiner* — Kidest Bahta
(74) *Attorney, Agent, or Firm* — Pearne & Gordon LLP

(57) ABSTRACT

A mounting board manufacturing system includes: a component placer including a placing head and a placing head mover that moves the placing head to a target position for placing the component on the board; an inspector that inspects a placement position of the component by imaging the board; a correction value calculator that calculates a correction value for correcting the target position; a target position calculator that calculates the target position using the correction value; and a correction value changer that changes a latest correction value used immediately before stopping an operation of the component placer to a correction value different from the latest correction value when the operation is resumed.

16 Claims, 9 Drawing Sheets

(56) References Cited

U.S. PATENT DOCUMENTS

| | | | |
|---|---|---|---|
| 2004/0153868 A1* | 8/2004 | Nonaka | G06Q 10/10 |
| | | | 714/47.2 |
| 2009/0064489 A1* | 3/2009 | Inoue | H05K 13/0812 |
| | | | 29/739 |
| 2010/0152877 A1* | 6/2010 | Maenishi | H05K 13/0413 |
| | | | 700/108 |
| 2012/0011714 A1* | 1/2012 | Hattori | H01L 21/681 |
| | | | 29/832 |
| 2013/0167361 A1 | 7/2013 | Kawaguchi et al. | |
| 2016/0227683 A1 | 8/2016 | Nakajima et al. | |
| 2017/0354070 A1 | 12/2017 | Kobayashi et al. | |

\* cited by examiner

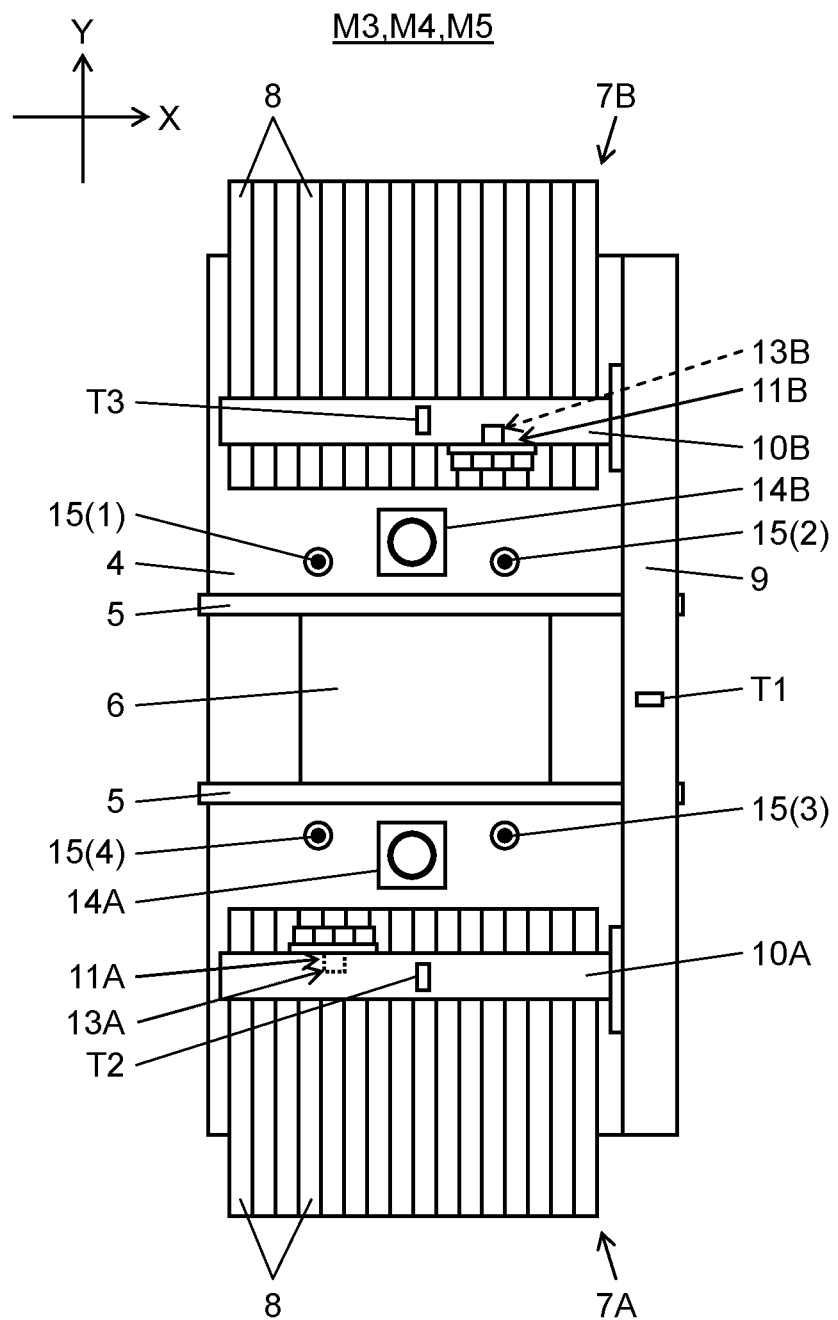

MOUNTING BOARD MANUFACTURING SYSTEM AND MOUNTING BOARD MANUFACTURING METHOD

CROSS REFERENCE TO RELATED APPLICATION(S)

This application is a continuation of U.S. patent application Ser. No. 16/057,848 filed on Aug. 8, 2018, which claims the priority from Japanese Patent Application No. 2017-160713 filed on Aug. 24, 2017, the entire contents of which are incorporated herein by reference.

BACKGROUND

1. Technical Field

The present disclosure relates to a mounting board manufacturing system and a mounting board manufacturing method for manufacturing a mounting board obtained by mounting a component on a board.

2. Description of the Related Art

The mounting board manufacturing system includes a component mounting line in which a plurality of component placing devices for mounting electronic components on a board are connected to each other. In each of the component placing devices, a component mounting operation of placing the components picked out from a component supply device on the board by a component mounting mechanism is repeatedly executed. Placement position accuracy in the component mounting operation is not constant and varies depending on various factors, such as a change-with-time in accordance with the lapse of operating time, for example, a thermal deformation of a beam that moves a placing head over time in a component placing mechanism. A component placing device having a function of correcting component placement positions by feeding back correction data reflecting a positional shift tendency of a component obtained from an inspection result of an inspection device provided in the component mounting line to each of the component placing devices in order to prevent degradation of the placement position accuracy caused by the variation factors, is known (for example, refer to Japanese Patent Unexamined Publication No. 2016-58603).

SUMMARY

A mounting board manufacturing system of the disclosure includes: a component placer including a placing head having a holding tool that holds a component and places the component on a board, and a placing head mover that moves the placing head to a target position for placing the component held by the holding tool at a component placement position of the board; an inspector that inspects a placement position of the component placed on the board by imaging the board on which the component is placed by the component placer; a correction value calculator that calculates a correction value for correcting the target position using an inspection result obtained by the inspector, and updates the correction value using a new inspection result when the new inspection result is obtained; a target position calculator that calculates the target position using the correction value; and a correction value changer that changes a latest correction value used immediately before stopping an operation of the component placer to a correction value different from the latest correction value when the operation is resumed after the component placer stops the operation and the component is to be placed by the component placer.

There is provided a mounting board manufacturing method of the disclosure including: a component placing step of placing a component on a board by a component placer including a placing head having a holding tool that holds the component and places the component on the board, and a placing head mover that moves the placing head to a target position for placing the component held by the holding tool at a component placement position of the board; an inspecting step of inspecting a placement position of the component placed on the board by imaging the board on which the component is placed in the component placing step; a correction value calculating step of calculating a correction value for correcting the target position using an inspection result obtained in the inspecting step, and updating the correction value using a new inspection result when the new inspection result is obtained; a target position calculating step of calculating the target position using the correction value; and a correction value changing step of changing a latest correction value used immediately before stopping an operation of the component placer to a correction value different from the latest correction value when the operation is resumed after the operation is stopped in the component placing step and the component placing step is to be executed again.

According to the disclosure, it is possible to suppress deterioration of installation position accuracy when resuming an operation after stopping continuous production.

BRIEF DESCRIPTION OF THE DRAWINGS

FIG. 2 is a plan view of a component placing device in a mounting board manufacturing system according to the embodiment of the disclosure;

DETAILED DESCRIPTIONS

Prior to describing the embodiments, problems in the related art will be briefly described. In the related art including the example of the above-described related art, there arises a disadvantage that placement position accuracy deteriorates when resuming an operation after a certain period of time has elapsed after the continuous production is stopped. In other words, a correction value in the above-described feedback includes a change-with-time component caused by a temperature rise of each part of a mechanism as an operation time elapses. However, after the production stops, the temperature of each part of the mechanism decreases and returns to a cooling state, and thus, when the correction value at the time of stop of the production is applied as it is, correction of the component placement position is not correctly performed, and the placement position accuracy deteriorates. In this manner, in the technique of the related art, in a configuration in which correction data reflecting a positional shift tendency of a component is fed back, there is a problem that the placement position accuracy when resuming the operation after the continuous production stops deteriorates.

Here, an object of the disclosure is to provide a mounting board manufacturing system and a mounting board manufacturing method which are capable of suppressing deterioration of the placement position accuracy when resuming the operation after stopping the continuous production.

Figure 1:
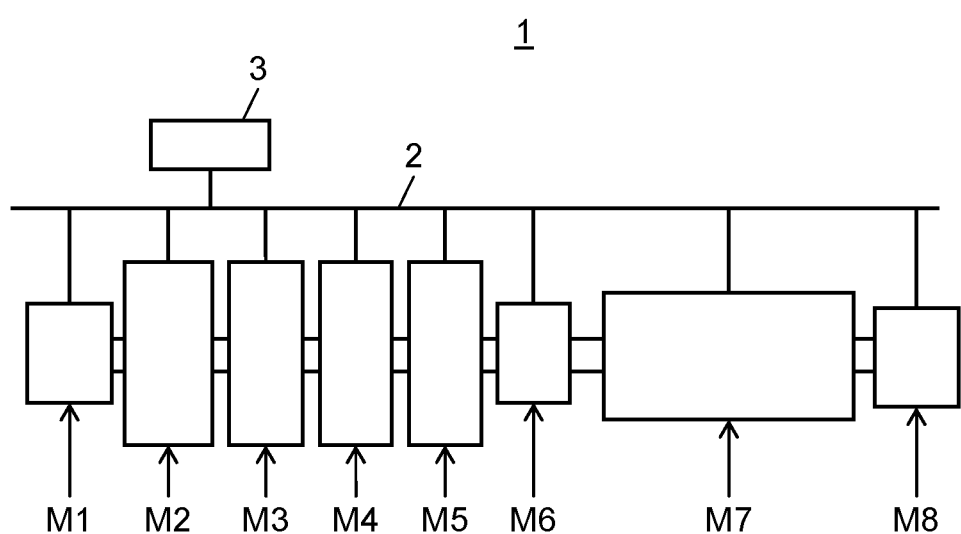
FIG. 1 is a block diagram illustrating a configuration of a mounting board manufacturing system according to an embodiment of the disclosure.

Next, embodiments of the disclosure will be described with reference to the drawings. First, with reference to FIG. 1, a configuration of mounting board manufacturing system 1 having a function of manufacturing a mounting board by mounting an electronic component on a board will be described. In FIG. 1, mounting board manufacturing system 1 is configured by connecting board supply device M1, solder printing device M2, component placing devices M3, M4, and M5, inspection device M6, reflow device M7, and mounting board collection device M8 in series. Each device is connected to each other by a board transport conveyor, and the board supplied by board supply device M1 on the upstream side (the left side in the drawing) is sequentially delivered to the device on the downstream side. In addition, the mounting board on which component placing work described hereinafter is completed is collected by mounting board collection device M8.

Solder printing device M2 prints solder for component bonding on the board supplied from board supply device M1. Component placing devices M3, M4, and M5 are component placers in mounting board manufacturing system 1, and the component is placed on the board on which the solder is printed. Inspection device M6 is an inspector in mounting board manufacturing system 1, and inspects the placement position of the component on the board on which the component is placed. Reflow device M7 melts and solidifies the solder by heating the board after the inspection and solder-bonds the placed component to the board.

Each of the above-described devices is mutually connected to each other via communication network 2 and is further connected to information processing device 3 via communication network 2. Accordingly, in mounting board manufacturing system 1, signals, information, and data are exchanged between each of board supply device M1 to mounting board collection device M8, and the inspection result by inspection device M6 can be fed back to the device on the upstream side. At the same time, various pieces of data uploaded to information processing device 3 from each of the devices is information-processed by information processing device 3, and it becomes possible to download the processed information by each of the devices.

Next, with reference to FIG. 2, the configuration and functions of component placing devices M3, M4, and M5 which serve as component placers in mounting board manufacturing system 1 will be described. In FIG. 2, board transporter 5 is disposed at the center of the upper surface of frame 4 in an X direction (board transport direction). Board transporter 5 transports board 6 delivered from the device on the upstream side, and positions and holds board 6 at a placing working position by the component placing mechanism which will be described hereinafter.

Component suppliers 7A and 7B are disposed on both sides of board transporter 5, and a plurality of tape feeders 8 are juxtaposed in component suppliers 7A and 7B. Tape feeder 8 pitch-feeds a carrier tape that holds a component to be mounted, and accordingly, the component is supplied to a component suction position by the component placing mechanism. At an end portion of one side in the X direction on the upper surface of frame 4, Y-axis beam 9 is arranged in a Y direction orthogonal to the X direction. Two X-axis beams 10A and 10B are coupled to Y-axis beam 9 in the Y direction to freely move, and a linear motor which is capable of separately moving X-axis beams 10A and 10B in the Y direction is provided.

Placing heads 11A and 11B are installed in the X direction to freely move on two X-axis beams 10A and 10B, respectively, and include a linear motor for moving placing heads 11A and 11B in the X direction. Placing heads 11A and 11B are multiple heads having a plurality of holding heads, and include suction nozzle 11a (refer to FIG. 3A) that serves as a holding tool which holds the component at a lower end portion of each of the holding heads and places the component on board 6.

X-axis beam 10A and Y-axis beam 9 configure XY table 12A (refer to FIG. 5), and by driving XY table 12A, placing head 11A moves in the X direction and in the Y direction. In addition, X-axis beam 10B and Y-axis beam 9 configure XY table 12B (refer to FIG. 5), and by driving XY table 12B, placing head 11B moves in the X direction and in the Y direction. In other words, the XY tables 12A and 12B are placing head movers for moving placing heads 11A and 11B.

Accordingly, two placing heads 11A and 11B suction, hold, and pick out the component from the component suction position of tape feeder 8 of each of corresponding component suppliers 7A and 7B by suction nozzle 11a, and place the component at the component placement position of board 6. The component placement position is a design position where the component of board 6 is supposed to be placed. In the above-described configuration, XY tables 12A and 12B and placing heads 11A and 11B configure the component placing mechanism for placing the component on board 6 by moving placing heads 11A and 11B that hold the component.

In the component placing operation by the component placing mechanism, XY tables 12A and 12B which are placing head movers move placing heads 11A and 11B to a target position for placing the component held by suction nozzle 11a at the component placement position of board 6. Here, the target position means moving target coordinates of placing head 11A (11B) in a coordinate system of XY table 12A (12B).

In other words, component placing devices M3, M4, and M5 which serve as the component placers illustrated in the embodiment are configured to include placing heads 11A and 11B having the holding tool that holds the component and places the component on board 6, and the placing head mover which moves placing heads 11A and 11B to the target position for placing the component held by the holding tool at the component placement position of board 6.

Component recognition cameras 14A and 14B are respectively disposed between component suppliers 7A and 7B and board transporter 5. When placing heads 11A and 11B which pick out the component from component suppliers 7A and 7B respectively move above component recognition cameras 14A and 14B, component recognition cameras 14A and 14B image the component in a state of being held by placing heads 11A and 11B. By recognizing the imaging result, positional shift of the component which is in a state of being held by placing heads 11A and 11B is detected.

On placing heads 11A and 11B, board recognition cameras 13A and 13B which are positioned on a lower surface side of X-axis beams 10A and 10B and move integrally with placing heads 11A and 11B, respectively, are installed. As placing heads 11A and 11B move, board recognition cameras 13A and 13B move above board 6 positioned in board transporter 5 and image board 6. By recognizing the imaging result, the component placement position on board 6 is recognized. In the component placing operation to board 6 by placing heads 11A and 11B, placement position correction is performed taking account of the result of component recognition by component recognition cameras 14A and 14B and the result of board recognition by board recognition cameras 13A and 13B.

In addition, in the following description, in order to simplify the description by omitting the redundancy, in a case of indicating the component placer having the above-described configuration, as long as there is no need to particularly distinguish elements existing in one pair, component suppliers 7A and 7B, X-axis beams 10A and 10B, placing heads 11A and 11B, XY table 12A and 12B, board recognition cameras 13A and 13B, and component recognition cameras 14A and 14B will be simply abbreviated as component supplier 7, X-axis beam 10, placing head 11, XY table 12, board recognition camera 13, component recognition camera 14, generically.

On the upper surface of frame 4 in component placing device M3, four position reference posts 15(1) to 15(4) stand as reference points for detecting the state of component placing device M3 in a disposition that surrounds board 6 in a state of being positioned in board transporter 5 from the surrounding. When detecting the state of component placing device M3, the positions of position reference posts 15(1) to 15(4) are imaged by board recognition camera 13 which moves by XY table 12. By recognizing the imaging result by image recognizer 24 (refer to FIG. 5), by detecting a state of change-with-time in which placing head 11 is displaced from a normal state by the thermal deformation of XY table 12, that is, a state of component placing device M3, it is possible to output numerical data indicating the state.

Figure 3A:
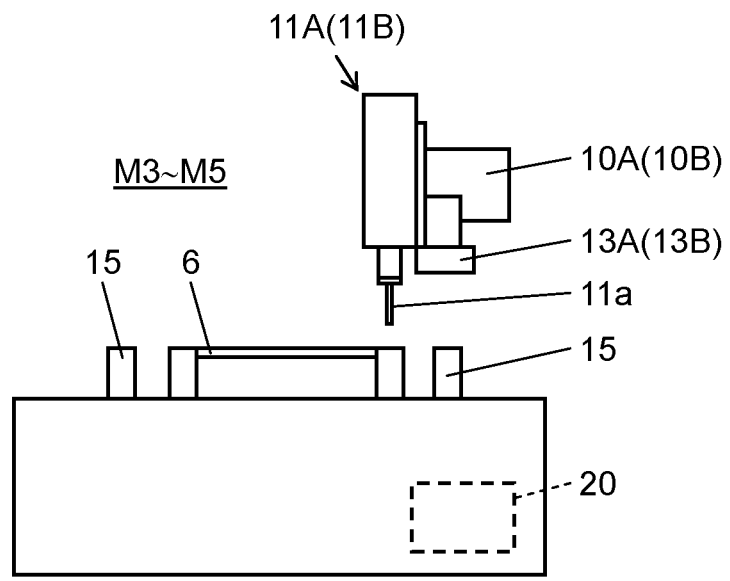
FIG. 3A is an explanatory view of state detection of a change-with-time by the component placing device in the mounting board manufacturing system according to the embodiment of the disclosure.
Figure 3B:
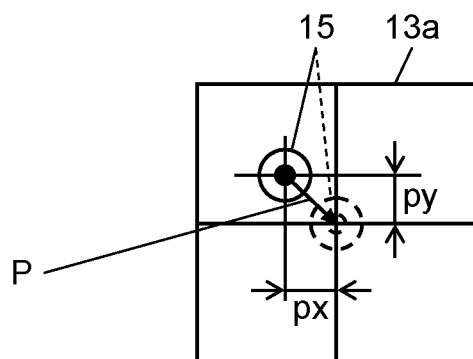
FIG. 3B is an explanatory view of state detection of the change-with-time by the component placing device in the mounting board manufacturing system according to the embodiment of the disclosure.

Detection of the state will be described with reference to FIGS. 3A, 3B, and 3C. First, FIG. 3A illustrates a state where placing head 11 is moved by XY table 12 and board recognition camera 13 is positioned above position reference post 15 to be recognized. The position of position reference post 15 that serves as the reference point is fixed to frame 4 to which component placing device M3 is attached. When moving placing head 11, the position indicated by normal position data of position reference post 15 is moved as a target. In addition, by imaging position reference post 15 with board recognition camera 13, the recognition image illustrated in FIG. 3B is obtained.

In other words, on recognition screen 13a of board recognition camera 13, the image indicating the upper surface of position reference post 15 appears in a state where the position is shifted from an optical coordinates original point of recognition screen 13a only by vector P (X direction component px and Y direction component py) which corresponds to a state caused by the thermal deformation of Y-axis beam 9, X-axis beam 10, and placing head 11. In other words, in a state where there is no thermal deformation, that is, in a state where Y-axis beam 9, X-axis beam 10, and placing head 11 are in a cooled state, the image of position reference post 15 on recognition screen 13a appears matching the original point of the optical coordinate system, and as the temperature increases and the thermal deformation increases, positional shift vector P indicating a state where the position of position reference post 15 is shifted increases. The positional shift vector P relatively indicates the position of the position reference post specified by the image of the position reference post.

Figure 3C:
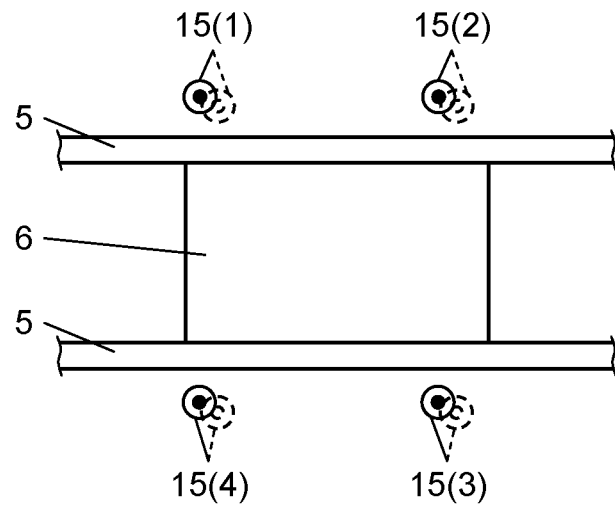
FIG. 3C is an explanatory view of state detection of the change-with-time by the component placing device in the mounting board manufacturing system according to the embodiment of the disclosure.

As illustrated in FIG. 3C, positional shift detection in which position reference post 15 is considered as a target is executed with respect to four position reference posts 15(1) to 15(4) disposed surrounding board 6. Accordingly, with respect to each of four position reference posts 15(1) to 15(4), positional shift vectors P which correspond to each of the posts are obtained. The combination of positional shift vectors P is numerical data indicating the state of the component placing device by vector components. In addition, the numerical data output in this manner is referred to when the correction value is changed by correction value changer 28 which will be described later.

Furthermore, on the upper surfaces of Y-axis beam 9 and X-axis beams 10A and 10B, temperature sensors T1, T2, and T3 which respectively serve as temperature measurers are installed substantially being positioned at the center in a longitudinal direction. Temperature sensors T1, T2, and T3 measure the temperatures of Y-axis beam 9 and X-axis beams 10A and 10B, and output the temperatures as numerical data indicating a temperature rising state caused by the continuous operation of component placing device M3. In addition, it is not necessary to set all temperature sensors T1, T2, and T3 as measurement targets, and at least one of the temperatures may be measured as the temperature of the representative point. In other words, in the example illustrated here, the temperature of at least one representative point is used as the numerical data indicating the state of component placing apparatus M3. In addition, similar to component placing device M3, component placing devices M4 and M5 also have a function of calculating the numerical data using the position reference post or the temperature sensor, that is, the numerical data indicating the state of component placing devices M4 and M5.

Figure 4A:
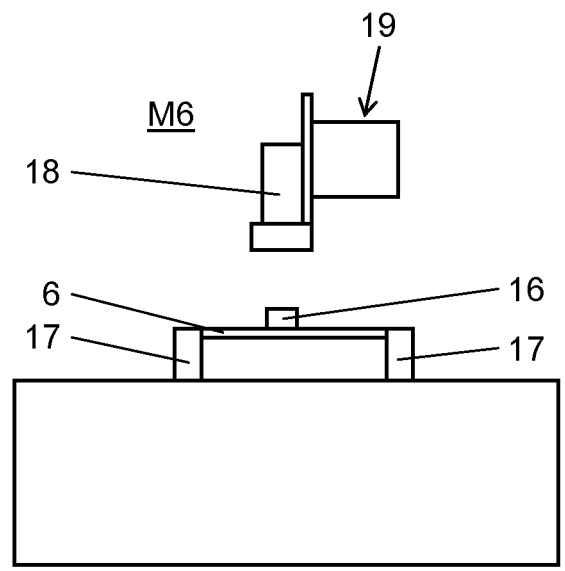
FIG. 4A is an explanatory view of placement position inspection by an inspection device in the mounting board manufacturing system according to the embodiment of the disclosure.
Figure 4B:
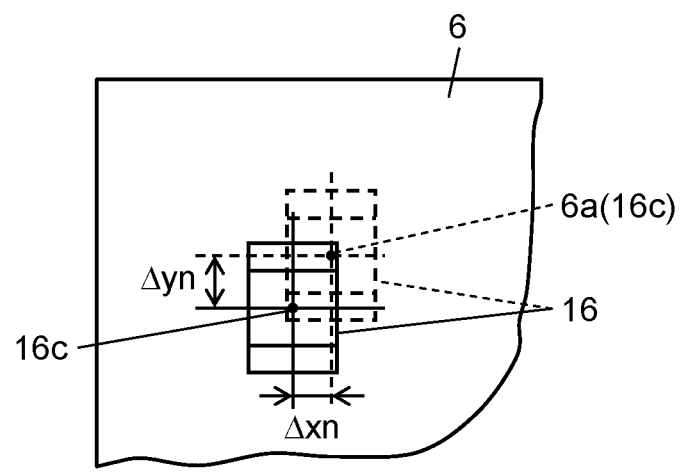
FIG. 4B is an explanatory view of placement position inspection by the inspection device in the mounting board manufacturing system according to the embodiment of the disclosure.

Board 6 on which the component is placed by component placing devices M3, M4, and M5 is inspected by inspection device M6 which is an inspector. Here, board 6 on which the component is placed is captured and the placement position of the component placed on board 6 is inspected. In other words, as illustrated in FIG. 4A, board 6 on which component 16 is placed is carried into board transporter 17 provided in inspection device M6. Inspection camera 18 is disposed above board transporter 17 so as to freely move in the horizontal direction by camera moving mechanism 19. By moving inspection camera 18 above component 16 to be inspected and recognizing the image captured by an inspection processor (not illustrated), placement positional shift amounts $\Delta xn$ and $\Delta yn$ illustrated in FIG. 4B are acquired.

Placement positional shift amounts $\Delta xn$ and $\Delta yn$ indicate a positional shift state between component placement position 6a where center point 16c of component 16 is supposed to match in the design data and center point 16c of component 16 which is actually placed on board 6. In addition, although only one component 16 to be inspected is illustrated here for the convenience of the description, in the actual component mounting work, the plurality of components 16 which are sequentially mounted by component placing devices M3, M4, and M5 on single board 6, and placement positional shift amounts $\Delta xn$ and $\Delta yn$ are obtained for each component 16.

Figure 5:
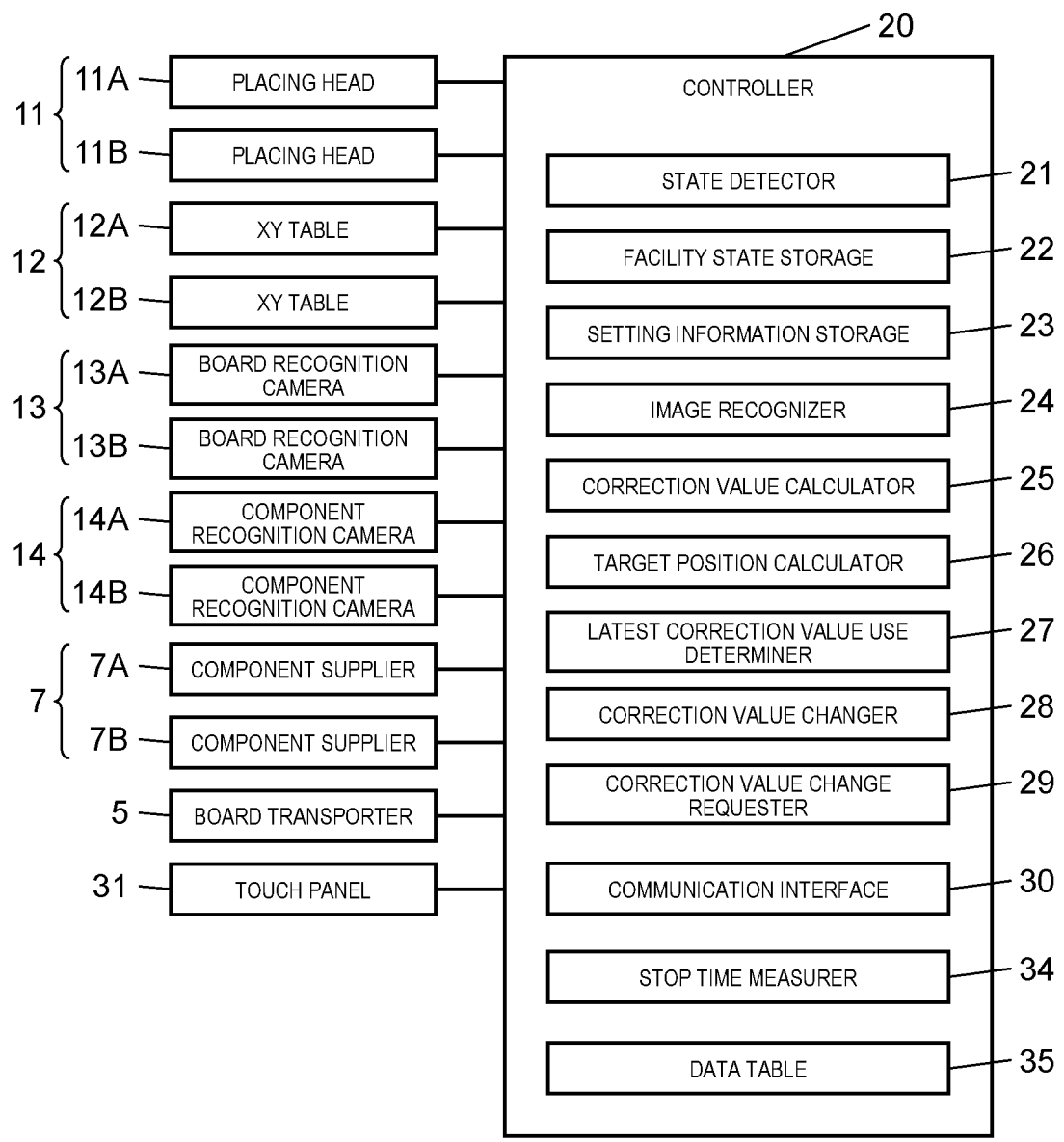
FIG. 5 is a block diagram illustrating a configuration of a control system of the component placing device in the mounting board manufacturing system according to the embodiment of the disclosure.

Placement positional shift amounts $\Delta xn$ and $\Delta yn$ which are obtained in this manner are the inspection results obtained by inspection device M6 which is the inspector. In mounting board manufacturing system 1, using the inspection result obtained in this manner, the correction value for correcting the above-described target position is calculated, and when the new inspection result is obtained, processing for updating the correction value for correcting the target position using the new inspection result is performed by the function of correction value calculator 25 (FIG. 5). In other words, the inspection result obtained considering the plurality of boards as targets sequentially by inspection device M6 is consecutively fed back to component placing devices M3, M4, and M5 via communication network 2.

In component placing devices M3, M4, and M5, the processing for calculating the target position by using the correction value calculated using the consecutively acquired inspection results is performed by the function of target position calculator 26 (FIG. 5). In addition, as a calculation method of the correction value, various calculation methods, such as a method in which the value obtained by multiplying placement positional shift amounts $\Delta xn$ and $\Delta yn$ which are the inspection results by a predetermined ratio is considered as the correction value, can be appropriately selected.

In mounting board manufacturing system 1 described in the embodiment, when calculating the correction value for correcting the target position using the inspection results, as described hereinafter, the numerical data indicating the state of change-with-time caused by the thermal deformation of XY table 12 in component placing devices M3, M4, and M5, is referred to.

Here, the change-with-time in a state in component placing device M3 will be described. In the component placing work, since a mounting turn which repeatedly moves placing head 11 between component supplier 7 and board 6 is executed with high frequency, in Y-axis beam 9 and X-axis beam 10, the temperature increases due to heat generation from the linear motor and the thermal deformation in which a temperature rising part thermally expands is generated.

By the thermal deformation, XY table 12 of which the original linear shape is maintained in the cooled state before the operation starts is deformed to a complicated curved shape in accordance with the heat generation state. In addition, the deformation changes with the lapse of time from the start of the operation, and after a lapse of a certain time, the thermal deformation becomes saturated and converges to a constant shape. In addition, after this, the thermal deformation is gradually eliminated as the temperature decreases by stopping the operation, and after completion of the cooling, the shape returns to the initial shape.

When the component mounting work is executed in a state where the thermal deformation occurs, a result in which component 16 is placed on board 6 is achieved while the position of placing head 11 in the horizontal direction is not stabilized due to the deformation of XY table 12. In other words, the component is placed on board 6 in a state where the position is shifted from the original component placement position on board 6. In addition, the positional shift amount is not constant in time series but varies depending on the state of the thermal deformation of XY table 12.

In order to suppress the placement positional shift caused by the change-with-time in a state of the thermal deformation of XY table 12, in mounting board manufacturing system 1 described in the embodiment, as described above, the inspection result obtained by inspection device M6 is consecutively fed back, and accordingly, the placement positional shift caused by the above-described change-with-time is corrected. However, in the method of sequentially feeding back the inspection results in this manner, since the correction value for correcting the placement positional shift is always a value that corresponds to the state at this time point, in a case of resuming the operation after stopping the operation in component placing device M3, the inconvenience is generated as will be described hereinafter.

In other words, after the operation is stopped in component placing device M3, the degree of thermal deformation of XY table 12 decreases depending on the elapsed time after stopping the operation, and the state of component placing device M3 changes. Therefore, when the correction value used immediately before stopping the operation is employed as it is when the operation is resumed, it is not possible to appropriately correct placement positional shift in a component placing operation after resuming the operation, and the deterioration of placement position accuracy is not caused.

In order to solve the inconvenience, in mounting board manufacturing system 1 described in the embodiment, the following processing is selectively executed such that the handling of the correction value when resuming the operation can be appropriately and reasonably performed. In other words, when component placing device M3 resumes the operation after stopping the operation and places the component, the latest correction value used immediately before stopping the operation is not used unconditionally as it is, and the correction value is calculated and changed according to the "setting related to the correction value when resuming the operation" registered in advance.

Figure 7:
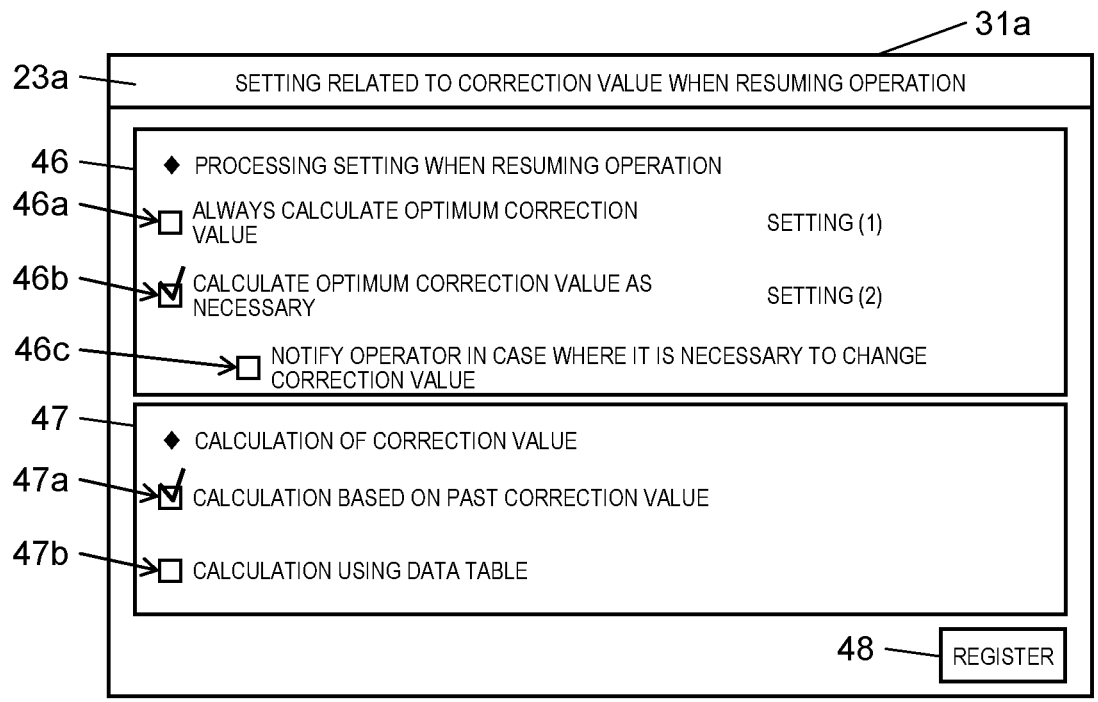
FIG. 7 is an explanatory view of a setting screen related to a correction value when resuming an operation in the mounting board manufacturing system according to the embodiment of the disclosure.

The setting regulates the aspect of the change in correction value in a case of resuming the operation after stopping the operation in advance, is input through a setting screen illustrated in FIG. 7, and is stored in setting information storage 23 (refer to FIG. 5). As illustrated in FIG. 7, on display screen 31a of touch panel 31 included in component placing device M3, the setting screen of "setting related to the correction value when resuming the operation" 23a is displayed. In "setting related to the correction value when resuming the operation" 23a, two items, such as "processing setting when resuming the operation" 46 and "calculation of the correction value" 47 are included. In addition, by operating registration operation button 48, the input contents are registered and stored in setting information storage 23.

"Processing setting when resuming the operation" 46 can select any of "always calculate the optimum correction value" (setting (1)) and "calculate the optimum correction value as necessary" (setting (2)) in advance by inputting a check into two-choice type check boxes 46*a* and 46*b*. When "always calculate the optimum correction value" in setting (1) is selected, processing for changing the latest correction value used immediately before stopping the operation to a correction value different from the latest correction value, is executed by the processing function of correction value changer 28 (refer to FIG. 5).

In addition, when "calculate the optimum correction value as necessary" in setting (2) is selected, first, processing for determining whether or not the latest correction value used immediately before stopping the operation is used, is executed by the processing function of latest correction value use determiner 27 (refer to FIG. 5). Here, when latest correction value use determiner 27 determines that the latest correction value used immediately before is not usable, processing for changing the latest correction value to a correction value different from the latest correction value, is executed by the processing function of correction value changer 28 (refer to FIG. 5). In other words, in the setting (2), only when it is determined that the latest correction value is not usable and it is necessary to change the correction value, processing for calculating the optimum correction value is executed.

Furthermore, in "processing setting when resuming the operation" 46, it is possible to select whether or not notification processing "for notifying an operator when it is necessary to change the correction value" is executed by inputting the check into check box 46*c*. By selecting execution of the notification processing, when it is determined that the latest correction value is not usable and it is necessary to change the correction value, the notification that it is necessary to change the correction value of the operator (operating person) of component placing device M3 is performed. The processing is performed by the processing function of correction value change requester 29 (refer to FIG. 5).

In "calculation of correction value" 47, by inputting checks into two-choice type check boxes 47*a* and 47*b*, when calculating the correction value in change in correction value by correction value changer 28, it becomes possible to select which one of "calculation based on the past correction value" and "calculation using the data table" is employed in advance. When "calculation based on the past correction value" is selected, in the change of the correction value, the past correction value stored in past correction value storage 43 (refer to FIG. 6) provided in control unit 40 of information processing device 3 is referred to. In other words, correction value changer 28 changes the latest correction value to one past correction value stored in past correction value storage 43 or a correction value obtained based on at least one past correction value.

In the calculation based on the past correction value, by comparing the current numerical data obtained by state detector 21 when resuming the operation and the past numerical data stored in facility state storage 22 with each other, at least one past correction value which is used at the time when the numerical data which is the same as or similar to the current numerical data is obtained, is selected. In addition, the latest correction value is changed to one past correction value among the selected at least one past correction value or to the correction value obtained based on the selected at least one past correction value. Being similar to the current numerical data means being included in a numerical value range obtained by the current numerical data. The numerical value range may be obtained according to a regulation determined in advance. For example, the upper limit and the lower limit of the numerical value range may be determined by a percentage relative to the current numerical data.

In other words, in the embodiment, when the numerical data indicating the device state is the same or similar, a state where the positional shift of the placement position in component placing device M3 also shows a similar tendency is determined. Therefore, the correction value that satisfies the condition that the numerical data is the same or similar is searched from the past correction value stored in past correction value storage 43, and one corresponding correction value is selected as the correction value after the change. In addition, when it is difficult to specify only one corresponding correction value in the past correction value, the correction value after the change is obtained by using the plurality of correction values selected by expanding similar conditions. In this case, arithmetic processing or the like for obtaining an average value is performed considering the plurality of selected correction values as targets. In addition, even when only one corresponding correction value can be specified, the correction value after the change may be obtained based on the specified correction value. For example, the arithmetic processing in which the specified correction value is multiplied by a predetermined coefficient, may be performed.

In addition, when "calculation using the data table" is selected, in the change of the correction value, the data table that defines the correlation between the stop time of component placing device M3 and the correction value is referred to. The stop time is the time from the stop of the operation of component placing device M3 to the resuming of the operation.

Here, when the stop time of component placing device M3 is the same, a state where the positional shift of the placement position in component placing device M3 also shows a similar tendency is determined. Therefore, by referring to the stop time acquired by the measurement as the above-described data table, it is possible to estimate an appropriate correction value at the time when the stop time is measured. In other words, in the embodiment, as illustrated in FIG. 5, controller 20 includes above-described data table 35 together with stop time measurer 34 that measures the stop time of component placing device M3. In addition, correction value changer 28 changes the latest correction value to the correction value obtained based on the stop time measured by stop time measurer 34 and the correlation defined in data table 35.

Figure 6:
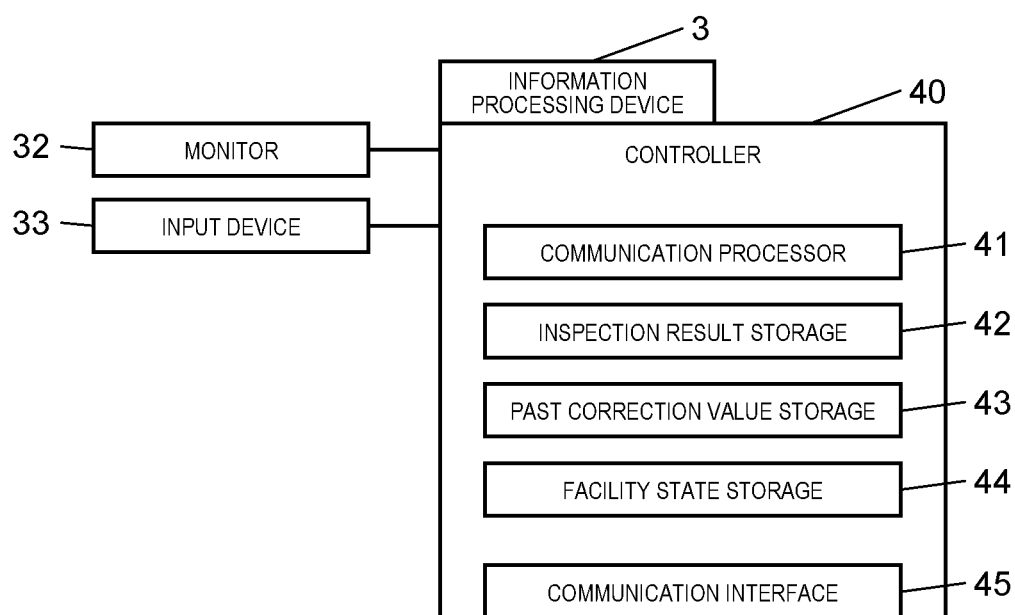
FIG. 6 is a block diagram illustrating a configuration of an information processing device in the mounting board manufacturing system according to the embodiment of the disclosure.

In order to enable the handling of the correction value when resuming the operation as described above, in the embodiment, control systems of component placing device M3 and information processing device 3 which configure mounting board manufacturing system 1 are configured as illustrated in FIGS. 5 and 6, respectively. First, with reference to FIG. 5, the configuration of the control system of component placing device M3 will be described. Here, among the control functions of component placing device M3, functions which are related to calculation and update of the correction value will be mainly described.

Placing head 11, XY table 12, board recognition camera 13, component recognition camera 14, component supplier 7, board transporter 5, and touch panel 31 are connected to controller 20 (refer to FIG. 5) embedded in component placing device M3. As controller 20 controls board transporter 5, the transport operation of board 6 in component placing device M3 is executed. As controller 20 controls component supplier 7, the component supply to placing head 11 by tape feeder 8 is performed. In addition, as controller 20 controls placing head 11 and XY table 12, the component placing on board 6 positioned and held in board transporter 5 is executed. Touch panel 31 is an operation input and display means, and displays an input screen and various setting screens for an operation input to controller 20.

Controller 20 includes state detector 21 that serves as an internal functional element, facility state storage 22, setting information storage 23, image recognizer 24, correction value calculator 25, target position calculator 26, latest correction value use determiner 27, correction value changer 28, and correction value change requester 29. Furthermore, controller 20 is connected to communication network 2 via communication interface 30. Accordingly, signals or data can be exchanged with other devices that configure mounting board manufacturing system 1, and data can be uploaded to information processing device 3 and data can be downloaded from information processing device 3.

State detector 21 detects the state of component placing device M3 which is a component placer, and outputs numerical data indicating the state. The plurality of pieces of output numerical data are stored in facility state storage 22. Correction value changer 28 compares the current numerical data obtained by state detector 21 when resuming the operation and the past numerical data stored in facility state storage 22 with each other, and selects at least one past correction value which is used at the time when numerical data which is the same as or similar to the current numerical data is obtained. In addition, the latest correction value is changed to one past correction value among the selected at least one past correction value or to the correction value obtained based on the selected at least one past correction value.

In addition, here, an example in which the past numerical data is stored in facility state storage 22 provided in component placing device M3 is described, but the past numerical data may be stored in facility state storage 44 provided in controller 40 of information processing device 3.

Here, as the configuration of state detector 21, it becomes possible to select a first configuration for imaging and recognizing position reference post 15 described above and a second configuration for measuring the temperature of the representative point provided in component placing device M3. In the first configuration of state detector 21, board recognition camera 13 moved by XY table 12, position reference post 15 that serves as at least one reference point fixed to frame 4, and image recognizer 24 that outputs the position of position reference post 15 in component placing device M3 which is specified by the image of position reference post 15 imaged by board recognition camera 13 as numerical data indicating the state of component placing device M3, are included.

In addition, the second configuration of state detector 21 is a configuration including a temperature measurer (temperature sensors T1, T2, and T3 (refer to FIG. 2)) that measures the temperature of at least one representative point of component placing device M3 and outputs the temperature as the numerical data indicating the state of component placing device M3.

In addition, instead of detecting the state of component placing device M3 by state detector 21, a configuration in which stop time measurer 34 that measures the stop time of component placing device M3 by the timing function of controller 20, and data table 35 that defines the correlation between the stop time and the correction value are included may be used. Data table 35 is stored in controller 20 or controller 40.

In this case, correction value changer 28 changes the latest correction value to the correction value obtained based on the time required from the stop to the resuming of the operation of component placing device M3 measured by stop time measurer 34 and the correlation defined in data table 35. In addition, when changing the correction value, as described above, the selection of calculation based on the past correction value or the calculation using data table 35 is regulated in "setting related to the correction value when resuming the operation" registered in advance (refer to FIG. 7).

Setting information storage 23 stores the above-described "setting related to the correction value when resuming the operation" 23a illustrated in FIG. 7. Image recognizer 24 recognizes the imaging result by board recognition camera 13 and component recognition camera 14. Accordingly, board recognition for recognizing the position of board 6 and component recognition for recognizing the position of the component held by placing head 11 are performed. Furthermore, by recognizing the imaging result of position reference post 15 by board recognition camera 13, the numerical data indicating the state due to the thermal deformation is output.

Correction value calculator 25 performs processing for calculating the correction value for correcting the target position using the inspection result obtained by inspection device M6, and updating the correction value using the new inspection result in a case of obtaining the new inspection result. Target position calculator 26 calculates the target position using the correction value calculated by correction value calculator 25 and updated. When component placing device M3 resumes the operation after stopping the operation and places the component, latest correction value use determiner 27 determines whether or not the latest correction value used immediately before stopping the operation is usable.

The determination as to whether or not the use is possible is performed based on the stop time of the operation of the facility and the numerical data indicating the device state output by state detector 21. In other words, based on the operation stop time of the facility, latest correction value use determiner 27 determines that the latest correction value is not usable when the time required for component placing device M3 to stop and resume the operation is longer than the time set in advance. In addition, based on the numerical data indicating the state of the device, latest correction value use determiner 27 compares the numerical data output by state detector 21 before component placing device M3 stops the operation and the numerical data output by state detector 21 when resuming the operation with each other, and as a result of the comparison, determines that the correction value is not usable when the difference is greater than a threshold value set in advance.

When component placing device M3 resumes the operation after stopping the operation and places the component, correction value changer 28 executes the processing for changing the latest correction value used immediately before stopping the operation to the correction value different from the latest correction value according to "setting related to the correction value when resuming the operation" 23a (refer to FIG. 7) registered in advance. In other words, when it is set to always calculate the optimum correction value, correction value changer 28 unconditionally changes the latest correction value to the optimum correction value different from the latest correction value. In addition, when it is set to calculate the correction value as necessary, correction value changer 28 changes that the latest correction value to the optimum correction value different from the latest correction value only when latest correction value use determiner 27 determines that the latest correction value is not usable.

When latest correction value use determiner 27 determines that the latest correction value is not usable, correction value change requester 29 performs processing for requesting the operating person of component placing device M3 to change the correction value. The processing is performed by, for example, displaying a notification that it is necessary to change the correction value to the operator who is an operating person on touch panel 31. In the notification, in "processing setting when resuming the operation" 46 of "setting related to the correction value when resuming the operation" 23*a* (refer to FIG. 7) stored in setting information storage 23, the notification is performed only when the notification processing is selected to be executed.

By making the notification, it is possible to inform the operator who is in charge of the device of the fact that a situation where it is determined that the correction value needs to be changed in the device and the correction value is automatically changed is achieved. Accordingly, when the operator determines that the change in correction value is inappropriate and inputs an answer to the determination, the processing for changing the correction value is suspended, and a situation where the inappropriate correction value is automatically set can be avoided.

Next, with reference to FIG. 6, the configuration of information processing device 3 will be described. In FIG. 6, monitor 32 and input device 33 are connected to controller 40 of information processing device 3. As an internal processing function, controller 40 includes communication processor 41, inspection result storage 42, past correction value storage 43, and facility state storage 44. Furthermore, controller 40 is connected to communication network 2 via communication interface 45.

Monitor 32 is a display device, and displays an operation screen at the time of an input operation by input device 33, a data screen that shows data stored in each part of controller 40, and the like. Communication processor 41 performs data communication processing with each of the devices that configure mounting board manufacturing system 1 via communication network 2. Accordingly, uploading of the data from each of the devices that configure mounting board manufacturing system 1 and downloading of the data stored in information processing device 3 to each of the devices are performed.

Inspection result storage 42 stores the inspection result by inspection device M6. Past correction value storage 43 stores a plurality of correction values used in the past by component placing device M3. Similar to facility state storage 22 illustrated in FIG. 5, facility state storage 44 stores the past numerical data output from state detector 21 in component mounting device M3.

Mounting board manufacturing system 1 is configured as described above, and the mounting board manufacturing method executed by mounting board manufacturing system 1 will be described hereinafter. First, the component placing operation executed by component placing device M3 that configures mounting board manufacturing system 1 will be described in accordance with the flow of FIG. 8. Here, the component placing operation in the normal operation state where the board placing is executed continuously in component placing device M3 is illustrated. The component placing operation corresponds to a component placing step in which the component is placed on the board by component placing device M3 which is the component placer having the above-described configuration in the mounting board manufacturing method.

In the mounting board manufacturing method, an inspecting step of inspecting the placement position of the component placed on the board by imaging the board on which the component is placed in the component placing step is executed by detection device M6 for each of the boards, and the obtained inspection result is stored in inspection result storage 42 of consecutive information processing device 3.

First, when starting the component placing operation, it is confirmed whether or not the board has been carried in (ST1). Here, the standby state is maintained until it is possible to confirm that the board is carried in, and when it is confirmed that the component is carried in, it is determined whether or not to detect the device state (ST2). Here, it is determined whether or not the timing at which the board is carried in corresponds to the timing at which the device state detection is supposed to be executed. In other words, it is determined whether the timing corresponds to an interval set in advance of the device state detection or whether the board corresponds to a predetermined number of the board to which the device state detection is supposed to be executed.

Here, in a case of corresponding to the timing and the board, the process proceeds to the next step and the detection of the device state is executed (ST3). Here, state detector 21 outputs the numerical data indicating the device state, and the output numerical data is stored in facility state storage 22. Following the detection of the device state, and in a case of skipping the detection of the device state, the inspection result is acquired (ST4). Here, the latest non-acquired inspection result among the inspection results stored in inspection result storage 42 of information processing device 3 is acquired via communication network 2. Here, when there is no latest non-acquired inspection result, acquisition of the inspection result is skipped.

Next, using the acquired inspection result, the correction value for correcting the target position is calculated (ST5). In (ST4), when the inspection result cannot be acquired, the previously calculated correction value is used as it is. In other words, here, the correction value for correcting the target position using the inspection result obtained in the inspecting step executed previously is calculated, and the correction value using the new inspection result in a case of obtaining the new inspection result is updated (correction value calculating step). In addition, here, a flow is described as a series of processing to (ST5) after the board is carried in, but the processing to (ST5) may be executed before the board is carried in.

Next, board recognition is performed (ST6). In other words, board 6 is imaged by board recognition camera 13, and the position of board 6 is recognized by recognizing the imaging result by image recognizer 24. Next, component holding is performed (ST7), and the component is picked out from component supplier 7 by placing head 11. Next, component recognition is performed (ST8). In other words, placing head 11 from which the component is picked out is moved to the part above component recognition camera 14, the component is imaged, and the position of the component is recognized by recognizing the imaging result by image recognizer 24.

Next, target coordinates are calculated (ST9). Here, the position coordinates of the XY table coordinate system which is the moving target to which placing head 11 that holds the component moves to place the component are calculated. In the calculation, placement position coordinates given by design data of the board and target coordinates further added by the correction value obtained in (ST5) as a result of the component recognition and as a result of the board recognition are obtained. At this time, when the components are held in plurality of suction nozzles 11a in multiple type placing head 11, the target coordinates are obtained for each of the plurality of components. In other words, here, using the correction value obtained by the calculation in (ST5), the target position where placing head 11 moves for placing the component is calculated (target position calculating step).

Next, component placement is performed (ST10). In other words, the component held by placing head 11 that has moved to the above-described target position is placed at the component placement position of board 6. Next, it is confirmed whether or not all of the work target components are placed (ST11), and when there is an unplaced component, the process returns to (ST7) and each step after the component holding is repeatedly executed. In addition, when the placement of all of the components is confirmed in (ST11), board carrying-out is performed (ST12). Next, the uploading of the correction value is executed (ST13).

Here, the correction value used in the target coordinate calculation in (ST9) is uploaded to information processing device 3 together with the recording of the date and time. In addition, when the device state detection is executed in (ST3), the numerical data output by state detector 21 is also uploaded to information processing device 3. The uploaded correction value and numerical data are stored in past correction value storage 43 and facility state storage 44 of information processing device 3, respectively.

Figure 9:
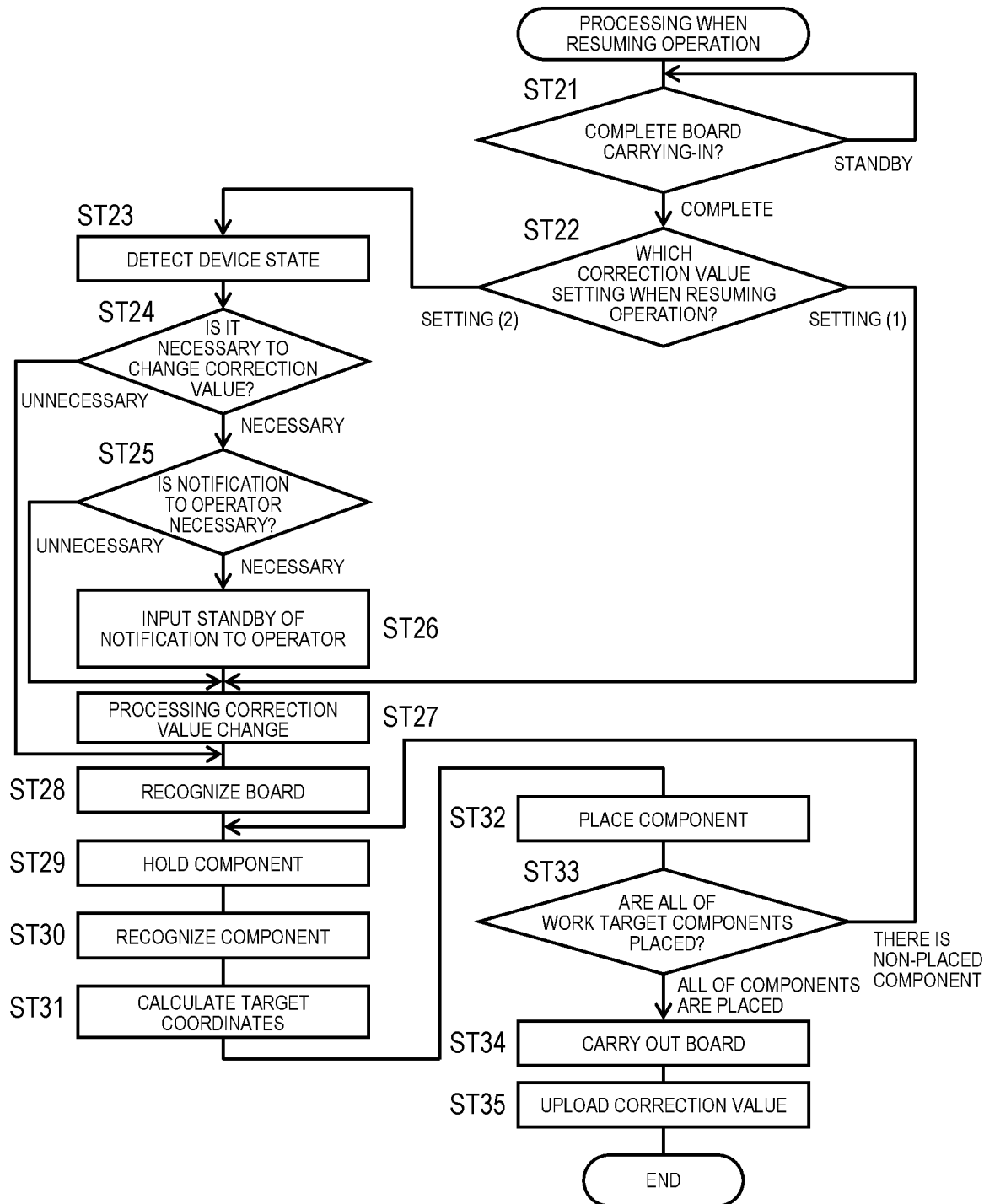
FIG. 9 is a flowchart illustrating processing when resuming the operation in the mounting board manufacturing system according to the embodiment of the disclosure.

Next, in the mounting board manufacturing method executed by mounting board manufacturing system 1, the processing when resuming the operation in a case of resuming the operation after stopping the operation of component placing device M3 and executing the component placing step again, will be described with reference to the flow of FIG. 9. First, when resuming the operation, it is confirmed whether or not the board has been carried in (ST21). Here, the standby state is maintained until it is possible to confirm that the board is carried in, and when it is confirmed that the component is carried in, the correction value setting when resuming the operation is confirmed (ST22). In other words, the calculation contents with respect to the calculation guideline of the correction value used for calculating the target position are confirmed.

Here, with reference to "setting related to the correction value when resuming the operation" 23a (refer to FIG. 7) stored in setting information storage 23 of controller 20, it is confirmed that the setting at the time of the operation is any of "always calculate the optimum correction value" (setting (1)) or "calculate the optimum correction value as necessary" (setting (2)). Here, when the setting content is "always calculate the optimum correction value" (setting (1)), the process proceeds as it is to the correction value change processing (ST27) for changing to the correction value to the optimum correction value. Here, when component placing device M3 resumes the operation after stopping the operation and executes the component placing step again in the component placing step, the correction value change processing for changing the latest correction value used immediately before stopping the operation to the correction value different from the latest correction value is executed by the processing function of correction value changer 28 (correction value changing step).

In the embodiment, the plurality of past correction values are stored in past correction value storage 43 of information processing device 3. In addition, in the above-described correction value changing step, the latest correction value used immediately before stopping the operation is changed to the past correction value stored in past correction value storage 43 or a correction value obtained based on at least one past correction value. In the correction value change based on the past correction value, the numerical data indicating the device state is referred to.

Figure 8:
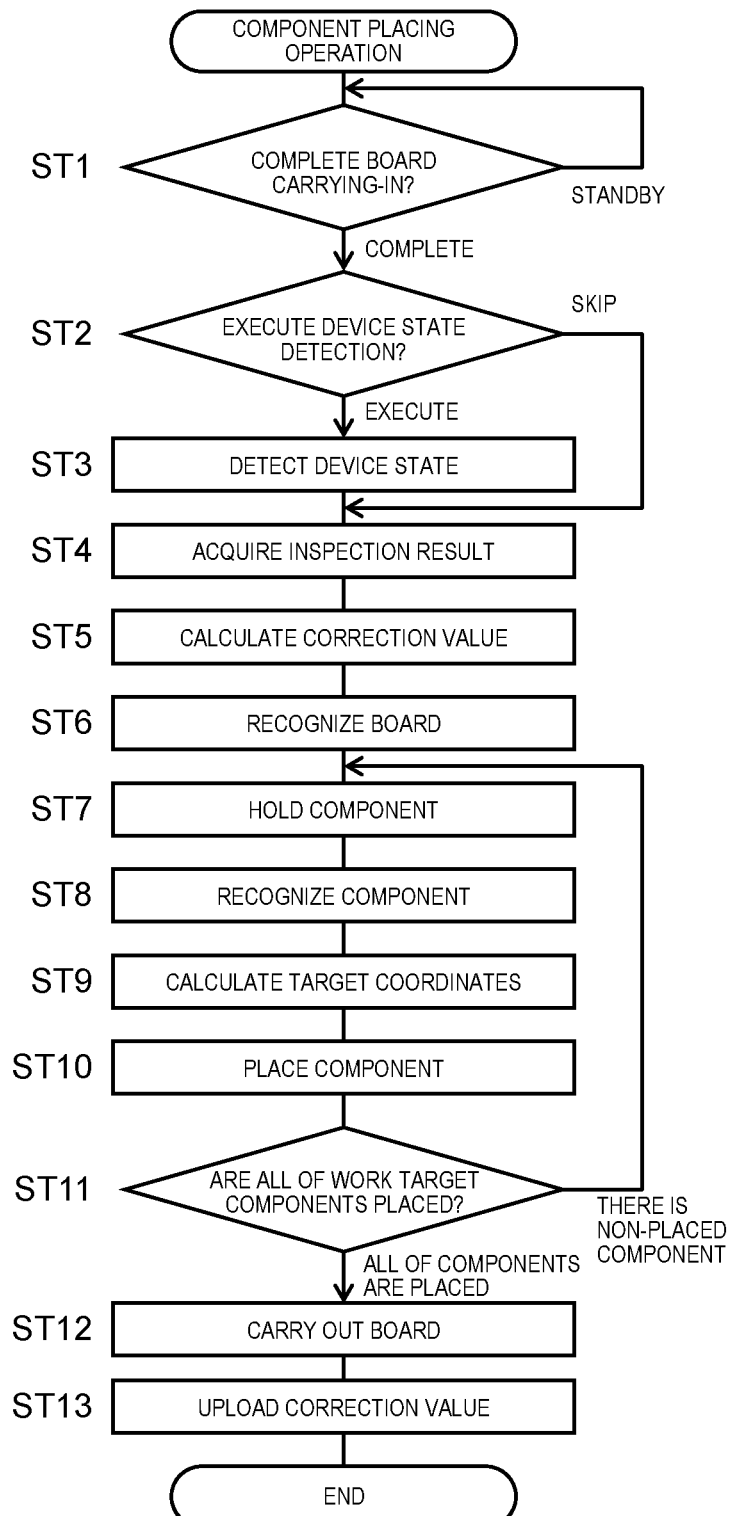
FIG. 8 is a flowchart illustrating a component placing operation in the mounting board manufacturing system according to the embodiment of the disclosure.

In other words, in the embodiment, in the component placing step described in FIG. 8, the state detecting step of detecting the state of component placing device M3 which is the component placer is executed by state detector 21 and the numerical data indicating the state is output, and the plurality of pieces of output past numerical data are stored in facility state storage 22 (or facility state storage 44 of information processing device 3). In addition, here, a flow is described as a series of processing to (ST27) after the board is carried in, but the processing to (ST27) may be executed before the board is carried in.

In the correction value change processing of (ST27), the current numerical data obtained in the state detecting step when resuming the operation and the stored past numerical data are compared with each other, and at least one past correction value which is used at the time when the numerical data which is the same as or similar to the current numerical data is selected. In addition, the latest correction value which is the target of the change is changed to one past correction value among the selected at least one past correction value or to the correction value obtained based on the selected at least one past correction value.

As an aspect of executing the state detecting step by state detector 21, the step is executed by selecting the first configuration for imaging and recognizing position reference post 15 described above and the second configuration for measuring the temperature of the representative point provided in component placing device M3. In the first configuration of the state detecting step, an image recognizing step of outputting the position of position reference post 15 in component placing device M3 which is specified by the image of position reference post 15 imaged by board recognition camera 13 as the numerical data indicating the state of component placing device M3 by imaging position reference post 15 that serves as at least one reference point fixed to frame 4 to which component placing device M3 is attached, by board recognition camera 13 that moves by XY table 12. In addition, in the second configuration of state detecting step, the temperature of at least one representative point of component placing device M3 is measured (refer to temperature sensors T1, T2, and T3 illustrated in FIG. 2), and the temperature is output as the numerical data indicating the state of component placing device M3.

In addition, instead of execution of the state detecting step of detecting the state of component placing device M3 by state detector 21, a stop time measuring step of measuring the stop time of component placing device M3 by the timing function of controller 20 may be executed. In this case, in the correction value changing step of (ST27), the latest correction value which is the change target is changed to the correction value obtained based on the time required from the stop to the resuming of the operation of component placing device M3 measured in stop time measuring step and the correlation defined in data table 35 that defines the correlation between the stop time and the correction value. Data table 35 used here is stored in controller 20 or controller 40.

On the other hand, when the setting content is "calculate the optimum correction value as necessary" (setting (2)), a series of processing for determining whether or not to change the correction value prior to the correction value change processing is executed. Here, when first the operation is resumed after stopping the operation in the component placing step and the component placing step is to be executed again, it is determined whether or not the latest correction value used immediately before stopping the operation is usable (latest correction value use determining step).

For the determination, the device state detection is performed here (ST23). In other words, device state detecting step of detecting the state of component placing device M3 is executed by state detector 21, and the numerical data indicating the state of the device is output. In addition, in the above-described latest correction value use determining step, the numerical data output in the device state detecting step (refer to (ST2) illustrated in FIG. 8) executed before component placing device M3 stops the operation and the numerical data output in the device state detecting step (ST23) executed when resuming the operation, are compared with each other.

In addition, as a result of the comparison, when the difference is greater than the threshold value set in advance, it is inappropriate to apply the same correction value because the state of the device is fluctuating, and it is determined that the latest correction value is not usable. Similar to the above-described example, an aspect of executing the state detecting step by state detector 21 described above, is executed by selecting the first configuration for imaging and recognizing position reference post 15 described above and the second configuration for measuring the temperature of the representative point provided in component placing device M3.

In addition, instead of execution of the state detecting step of detecting the state of component placing device M3 by state detector 21, a stop time measuring step of measuring the stop time of component placing device M3 by the timing function of controller 20 may be executed. In other words, in the latest correction value use determining step, when the time required for component placing device M3 to stop and resume the operation is longer than the time set in advance, the fluctuation in device state is estimated to be large and it is determined that the latest correction value is not usable due to the similar reasons.

In this manner, when it is determined whether or not the latest correction value is usable based on the result of the device state detection of (ST23) or the result of the stop time measurement, based on the results, the necessity of changing the correction value is determined (ST24). In other words, when it is determined that the latest correction value used immediately before stopping the operation can be used as it is, it is unnecessary to change the correction value, and in this case, the process proceeds to (ST28).

On the other hand, when it is determined that the latest correction value is unusable, it is determined that it is necessary to change the correction value. In addition, in this case, it is determined whether or not the notification to the operator is required. Here, by referring to "setting related to the correction value when resuming the operation" 23a (refer to FIG. 7) stored in setting information storage 23, in "processing setting when resuming the operation" 46, it is confirmed whether or not the notification processing "for notifying the operator when it is necessary to change the correction value" is selected to be executed. When the execution of the notification processing is not selected here, it is determined that the notification to the operator is unnecessary, and the process proceeds to (ST27).

In addition, when execution of the notification processing is selected, it is determined that the notification to the operator is necessary, and the states of the operator notification and input standby are achieved (ST26), that is, when latest correction value use determiner 27 determines that the latest correction value is not usable, it is required for the operator (operating person) of the component placing device M3 to change the correction value by the function of correction value change requester 29 (refer to FIG. 5). In addition, when the operator inputs an answer to an approval of changing the correction value, the process moves to (ST27), and the correction value change processing is executed.

The correction value change processing executed here is the same as the processing executed in the setting (1). In other words, in the above-described step, the processing executed in a case of the setting (2) is an aspect in which the latest correction value use determining step of determining whether or not the latest correction value used immediately before stopping the operation is usable is executed when the operation is resumed after stopping the operation in the component placing step and the component placing step is to be executed again, and the correction value changing step of changing the latest correction value to the correction value different from the latest correction value is included when it is determined that the correction value is not usable here.

When the correction value change processing is performed in this manner (ST27), each step of board recognition (ST28), component holding (ST29), component recognition (ST30), target coordinate calculation (ST31), component placing (ST32), confirmation as to whether all of the work target components have been placed (ST33), board carrying-out (ST34), and correction value upload (ST35) is sequentially executed. Each of the processing steps of the above-described (ST28) to (ST35) is the same as each of processing steps illustrated in (ST6) to (ST13) in FIG. 8.

As described above, in the mounting board manufacturing system and the mounting board manufacturing method which are described in the embodiment, in the configuration in which the placement position of the component is inspected by imaging the board on which the component is placed by the component placer, the correction value for correcting the target position of the placement is calculated using the inspection result, the correction value is updated using the new inspection result when the new inspection result is obtained, and the target position is calculated using the correction value, the latest correction value used immediately before stopping the operation is changed to the correction value different from the latest correction value calculated based on the result of detecting the device state when the operation is resumed after the component placer stops the operation and the component is to be placed by the component placer. Accordingly, it is possible to avoid a situation where the correction value that does not conform to the device state changed by the operation stop is used as it is, and to suppress the deterioration of placement position accuracy when resuming the operation after stopping continuous production.

In addition, in the same configuration, when the component placer resumes the operation after stopping the operation and the component is placed by the component placer, it is determined whether or not the latest correction value used immediately before stopping the operation is usable, and when it is determined that the latest correction value is not usable, the latest correction value is changed to the correction value different from the latest correction calculated based on the result of detecting the device state.

Accordingly, in addition to the above-described effects, not being limited only to a case where it is necessary to change the processing for changing the correction value, it is possible to make data management for appropriately managing the correction value efficient.

In addition, a part of mounting board manufacturing system 1 according to the disclosure can be realized by an integrated circuit or the like. A part of mounting board manufacturing system 1 can be configured with, for example, a microcontroller, a CPU, or the like. In other words, a part of the functions of mounting board manufacturing system 1 may be realized by combining hardware and software. Here, the software is, for example, a program stored in the memory of mounting board manufacturing system 1. In addition, each storage of mounting board manufacturing system 1 can be realized by, for example, a hard disk drive (HDD), a solid state drive (SSD), or the like.

The mounting board manufacturing system and the mounting board manufacturing method of the disclosure have an effect that it is possible to suppress deterioration of the placement position accuracy when resuming the operation after stopping the continuous production, and is advantageous in a field of manufacturing the mounting board obtained by mounting the component on the board.

What is claimed is:

1. A mounting board manufacturing system comprising:
   a component placer including a placing head having a holding tool that holds a component and places the component on a board, a placing head mover that moves the placing head to a target position for placing the component held by the holding tool at a component placement position of the board, and a state detector that detects a state of the component placer and outputs numerical data indicating the state of the component placer;
   an inspector that inspects a placement position of the component placed on the board by imaging the board on which the component is placed by the component placer;
   a correction value calculator that calculates a correction value for correcting the target position using an inspection result obtained by the inspector, and updates the correction value using a new inspection result when the new inspection result is obtained; and
   a correction value changer that changes a latest correction value used immediately before stopping an operation of the component placer to a correction value different from the latest correction value based on a result of comparing a current numerical data obtained by the state detector when the operation of the component placer is resumed with at least one piece of past numerical data outputted from the state detector.

2. The mounting board manufacturing system of claim 1, wherein the state detector includes a camera that moves by the placing head mover, at least one reference point fixed to a frame to which the component placer is attached, and an image recognizer that outputs a position of the at least one reference point in the component placer based on an image of the at least one reference point imaged by the camera, wherein the numerical data indicating the state of the component placer represents the position of the at least one reference point in the component placer outputted by the image recognizer.

3. The mounting board manufacturing system of claim 1, wherein the state detector includes a temperature measurer that measures a temperature of at least one representative point of the component placer, and outputs the measured temperature as the numerical data indicating the state of the component placer.

4. The mounting board manufacturing system of claim 1, further comprising:
   a past correction value storage that stores a plurality of past correction values which are used in the past,
   wherein the correction value changer changes the latest correction value to one past correction value among the plurality of past correction values stored in the past correction value storage or to a correction value obtained based on at least one of the plurality of past correction values.

5. The mounting board manufacturing system of claim 1, wherein the component placer further includes a facility state storage that stores a plurality of pieces of the past numerical data outputted from the state detector, and wherein the correction value changer:
   selects at least one past correction value which is used at a time when numerical data that is included in a numerical value range of a current numerical data is obtained by comparing the current numerical data obtained by the state detector when the operation of the component placer is resumed and at least one piece of the past numerical data among the plurality of pieces of past numerical data stored in the facility state storage with each other, and
   changes the latest correction value to one past correction value among the selected at least one past correction value or to a correction value obtained based on the selected at least one past correction value.

6. The mounting board manufacturing system of claim 1, further comprising:
   a stop time measurer that measures a stop time from stop of the operation of the component placer to resuming of the operation; and
   a data table that defines a correlation between the stop time and the correction value,
   wherein the correction value changer changes the latest correction value to a correction value obtained based on the stop time measured by the stop time measurer and the correlation defined in the data table.

7. A mounting board manufacturing method comprising:
   a component placing step of placing a component on a board by a component placer including a placing head having a holding tool that holds the component and places the component on the board, and a placing head mover that moves the placing head to a target position for placing the component held by the holding tool at a component placement position of the board;
   a state detecting step of detecting a state of the component placer and outputting numerical data indicating the state of the component placer;
   an inspecting step of inspecting a placement position of the component placed on the board by imaging the board on which the component is placed in the component placing step;
   a correction value calculating step of calculating a correction value for correcting the target position using an inspection result obtained in the inspecting step, and updating the correction value using a new inspection result when the new inspection result is obtained; and
   a correction value changing step of changing a latest correction value used immediately before stopping an operation of the component placer to a correction value different from the latest correction value based on a result of comparing a current numerical data obtained during the state detecting step when the operation of the component placer is resumed with at least one piece of past numerical data outputted during the state detecting step.

8. The mounting board manufacturing method of claim 7, wherein, the state detecting step comprises:
moving, by a camera, by the placing head mover, imaging at least one reference point fixed to a frame to which the component placer is attached, and
outputting a position of the at least one reference point in the component placer based on an image of the at least one reference point imaged by the camera as the numerical data indicating the state of the component placer, wherein the numerical data indicating the state of the component placer represents the position of the at least one reference point in the component placer outputted during the state detecting step.

9. The mounting board manufacturing method of claim 7, wherein, the state detecting step comprises:
measuring a temperature of at least one representative point of the component placer, and
outputting the measured temperature as numerical data indicating the state of the component placer.

10. The mounting board manufacturing method of claim 7,
further comprising storing a plurality of past correction values which are used in the past,
wherein, in the correction value changing step, the latest correction value is changed to one past correction value among the plurality of past correction values being stored or to a correction value obtained based on at least one of the plurality of past correction values.

11. The mounting board manufacturing method of claim 7,
wherein the state detecting step comprises, storing a plurality of pieces of outputted past numerical data,
wherein, in the correction value changing step, at least one past correction value which is used at a time when numerical data that is included in a numerical value range of a current numerical data is obtained is selected comparing the current numerical data obtained in the state detecting step when the operation of the component placer is resumed and at least one piece of the past numerical data among the plurality of pieces of past numerical data being stored with each other, and
wherein the latest correction value is changed to one past correction value among the selected at least one past correction value or to a correction value obtained based on the selected at least one past correction value.

12. The mounting board manufacturing method of claim 7, further comprising:
a stop time measuring step of measuring a stop time from stop of the operation of the component placer to resuming of the operation,
wherein, in the correction value changing step, the latest correction value is changed to a correction value obtained based on the stop time measured in the stop time measuring step and a correlation defined in a data table that defines the correlation between the stop time and the correction value.

13. A mounting board manufacturing system comprising:
a component placer including;
a placing head having a holding tool that holds a component and places the component on a board,
a placing head mover that moves the placing head to a target position for placing the component held by the holding tool at a component placement position of the board, and
a state detector that detects a state of the component placer and outputs numerical data indicating the state of the component placer, wherein the state detector includes one of;
a camera that moves by the placing head mover, at least one reference point fixed to a frame to which the component placer is attached, and an image recognizer that outputs a position of the at least one reference point in the component placer based on an image of the at least one reference point imaged by the camera as the numerical data indicating the state of the component placer, wherein the numerical data indicating the state of the component placer represents the position of the at least one reference point in the component placer outputted by the image recognizer, or
a temperature measurer that measures a temperature of at least one representative point of the component placer, and outputs the measured temperature as the numerical data indicating the state of the component placer;
an inspector that inspects a placement position of the component placed on the board by imaging the board on which the component is placed by the component placer;
a correction value calculator that calculates a correction value for correcting the target position using an inspection result obtained by the inspector, and updates the correction value using a new inspection result when the new inspection result is obtained; and
a correction value changer that changes a latest correction value used immediately before stopping an operation of the component placer to a correction value different from the latest correction value based on a result of comparing a current numerical data obtained by the state detector when the operation of the component placer is resumed with at least one piece of past numerical data outputted from the state detector.

14. The mounting board manufacturing system of claim 13, further comprising:
a past correction value storage that stores a plurality of past correction values which are used in the past,
wherein the correction value changer changes the latest correction value to one past correction value among the plurality of past correction values stored in the past correction value storage or to a correction value obtained based on at least one of the plurality of past correction values.

15. The mounting board manufacturing system of claim 13,
wherein the component placer further includes a facility state storage that stores a plurality of pieces of the past numerical data outputted from the state detector, and
wherein the correction value changer:
selects at least one past correction value which is used at a time when numerical data that is included in a numerical value range of a current numerical data is obtained by comparing the current numerical data obtained by the state detector when the operation of the component placer is resumed and at least one piece of the past numerical data among the plurality of pieces of past numerical data stored in the facility state storage with each other, and changes the latest correction value to one past correction value among the selected at least one past correction value or to a correction value obtained based on the selected at least one past correction value.

16. The mounting board manufacturing system of claim 13, further comprising:
a stop time measurer that measures a stop time from stop of the operation of the component placer to resuming of the operation; and
a data table that defines a correlation between the stop time and the correction value,
wherein the correction value changer changes the latest correction value to a correction value obtained based on the stop time measured by the stop time measurer and the correlation defined in the data table.

\* \* \* \* \*